(12) United States Patent
Okuda et al.

(10) Patent No.: US 11,262,421 B2
(45) Date of Patent: Mar. 1, 2022

(54) MAGNETIC DETECTION ELEMENT HAVING ELEMENT PART AND METAL FILM

(71) Applicant: DENSO CORPORATION, Kariya (JP)

(72) Inventors: Yasuyuki Okuda, Kariya (JP); Atsushi Kobayashi, Kariya (JP); Hiroki Kajio, Kariya (JP); Michihiro Makita, Kariya (JP)

(73) Assignee: DENSO CORPORATION, Kariya (JP)

( * ) Notice: Subject to any disclaimer, the term of this patent is extended or adjusted under 35 U.S.C. 154(b) by 340 days.

(21) Appl. No.: 16/234,938

(22) Filed: Dec. 28, 2018

(65) Prior Publication Data

US 2019/0137577 A1    May 9, 2019

Related U.S. Application Data (63) Continuation of application No. PCT/JP2017/030229, filed on Aug. 24, 2017.

(30) Foreign Application Priority Data

Oct. 14, 2016  (JP) .............................. JP2016-202399

(51) Int. Cl.
*G01R 33/09* (2006.01)
*H01L 43/08* (2006.01)

(52) U.S. Cl.
CPC .......... *G01R 33/09* (2013.01); *G01R 33/093* (2013.01); *H01L 43/08* (2013.01)

(58) Field of Classification Search
CPC .... G01R 33/09; G01R 33/091; G01R 33/093; G01R 33/095; G01R 33/096; G01R 33/098; H01L 43/08
See application file for complete search history.

(56) References Cited

U.S. PATENT DOCUMENTS

| | | | | |
|---|---|---|---|---|
| 2001/0030540 | A1* | 10/2001 | Doescher | G01R 33/09 324/332 |
| 2001/0038286 | A1* | 11/2001 | Doescher | G01R 33/09 324/332 |
| 2013/0038421 | A1* | 2/2013 | Kawasaki | H01F 10/3272 338/32 R |
| 2019/0187225 | A1* | 6/2019 | Ide | H01F 10/3268 |

FOREIGN PATENT DOCUMENTS

| | | |
|---|---|---|
| JP | H05-264701 A | 10/1993 |
| JP | H06-148301 A | 5/1994 |
| JP | H07-078528 B2 | 8/1995 |

* cited by examiner

*Primary Examiner* — Jermele M Hollington
*Assistant Examiner* — Suresh K Rajaputra
(74) *Attorney, Agent, or Firm* — Posz Law Group, PLC (57) ABSTRACT

A magnetic detection element includes an element part and a metal film. The element part is arranged on a surface of a substrate, and has linear portions arranged in parallel with each other and connecting portions connecting the linear portions in a meandering shape. The metal film has a first layered portion stacked on a turn portion of the element part defined by the connecting portion and a connection between the connecting portion and the linear portion, and a second layered portion formed integrally with the first layered portion to entirely cover a region of the surface surrounded by an internal end of the turn portion. The first layered portion has a peripheral side disposed between the internal end and an external end of the turn portion so as to expose an outer periphery of the turn portion.

7 Claims, 7 Drawing Sheets

MAGNETIC DETECTION ELEMENT HAVING ELEMENT PART AND METAL FILM

CROSS REFERENCE TO RELATED APPLICATION

The present application is a continuation application of International Patent Application No. PCT/JP2017/030229 filed on Aug. 24, 2017, which designated the U.S. and claims the benefit of priority from Japanese Patent Application No. 2016-202399 filed on Oct. 14, 2016. The entire disclosures of all of the above applications are incorporated herein by reference.

TECHNICAL FIELD

The present disclosure relates to a magnetic detection element for detecting a change in a magnetic field.

BACKGROUND ART

A magnetic detection element includes an element part made of a thin-film magnetoresistive element formed in a meandering shape. A metal film is stacked on a U-shape turn portion of the magnetoresistive element. The metal film is formed over the entire line width of the turn portion.

SUMMARY

According to one aspect of the present disclosure, a magnetic detection element includes an element part and a metal film. The element part is arranged on a surface of a substrate as a ferromagnetic thin film. The element part has a plurality of linear portions arranged in parallel with each other and a plurality of connecting portions connecting the plurality of linear portions in a meandering shape. The metal film has a resistance value smaller than that of the element part, and the resistance value of the metal film is not changed by an external magnetic field.

The metal film has a first layered portion stacked on a turn portion of the element part defined by the connecting portion and a connection between the connecting portion and the linear portion, and a second layered portion formed integrally with the first layered portion to entirely cover a region of the surface surrounded by an internal end of the turn portion.

The first layered portion has a peripheral side disposed between the internal end and an external end of the turn portion so as to expose an outer periphery of the turn portion.

DETAILED DESCRIPTION

To begin with, examples of relevant techniques will be described.

A magnetic detection element includes an element part made of a thin-film magnetoresistive element formed in a meandering shape. A metal film is stacked on a U-shape turn portion of the magnetoresistive element. The metal film is formed over the entire line width of the turn portion. As a result, since electric current flows through the metal film at the turn portion, the electric current is not affected by a change in resistance of the turn portion caused by the external magnetic field. Therefore, reduction in the sensitivity of the element part can be suppressed.

The meandering-shaped magnetoresistive element may be formed using a mask specific to the element part, and then the metal film may be laminated on the turn portion by using a mask specific to the metal film. In this case, if the metal film laminated on one turn portion has a positional deviation, the metal film may interfere, such as in contact with, the adjacent turn portion.

Therefore, in the conventional technique, it is necessary to previously secure a distance between the adjacent turn portions in consideration of the positional displacement of the metal film with respect to the turn portion of the element part. For this reason, it is difficult to further reduce the area of the element part.

Further, the metal film may not be stacked on the inner side of the turn portion due to the positional deviation of the metal film. Since the electric current flows through a path where the electric resistance is the minimum, some current flows not inside the metal film but the inner side of the turn portion. If the electric current is influenced by a change in resistance of the turn portion due to the external magnetic field, the sensitivity of the element part may be lowered.

The present disclosure provides a magnetic detection element in which a decrease in the sensitivity of the element part is suppressed while further reducing the area of the element part.

According to one aspect of the present disclosure, a magnetic detection element includes an element part and a metal film. The element part is arranged on a surface of a substrate as a ferromagnetic thin film. The element part has a plurality of linear portions arranged in parallel with each other and a plurality of connecting portions connecting the plurality of linear portions in a meandering shape. The metal film has a resistance value smaller than that of the element part, and the resistance value of the metal film is not changed by an external magnetic field.

The metal film has a first layered portion stacked on a turn portion of the element part defined by the connecting portion and a connection between the connecting portion and the linear portion, and a second layered portion formed integrally with the first layered portion to entirely cover a region of the surface surrounded by an internal end of the turn portion.

The first layered portion has a peripheral side disposed between the internal end and an external end of the turn portion so as to expose an outer periphery of the turn portion.

Accordingly, since the peripheral side of the first layered portion is arranged on the inner side of the external end of the turn portion, the first layered portion does not interfere with the adjacent turn portion. Therefore, it is unnecessary to previously secure an interval between the linear portions adjacent to each other and an interval between the turn portions adjacent to each other. Thus, it is possible to further reduce the area of the element part.

In addition, since the second layered portion is disposed in a region surrounded by the internal end of the turn portion, the metal film is necessarily disposed at the inner side of the turn portion. Therefore, since the current is not influenced by change in resistance of the turn portion caused by the external magnetic field, it is possible to suppress the decrease in the sensitivity of the element part. Therefore, it is possible to suppress a decrease in the sensitivity of the element part and to further reduce the area of the element part.

Embodiments will be described with reference to the drawings. In the following embodiments, identical or equivalent elements are denoted by the same reference numerals as each other in the figures.

First Embodiment

Figure 1:
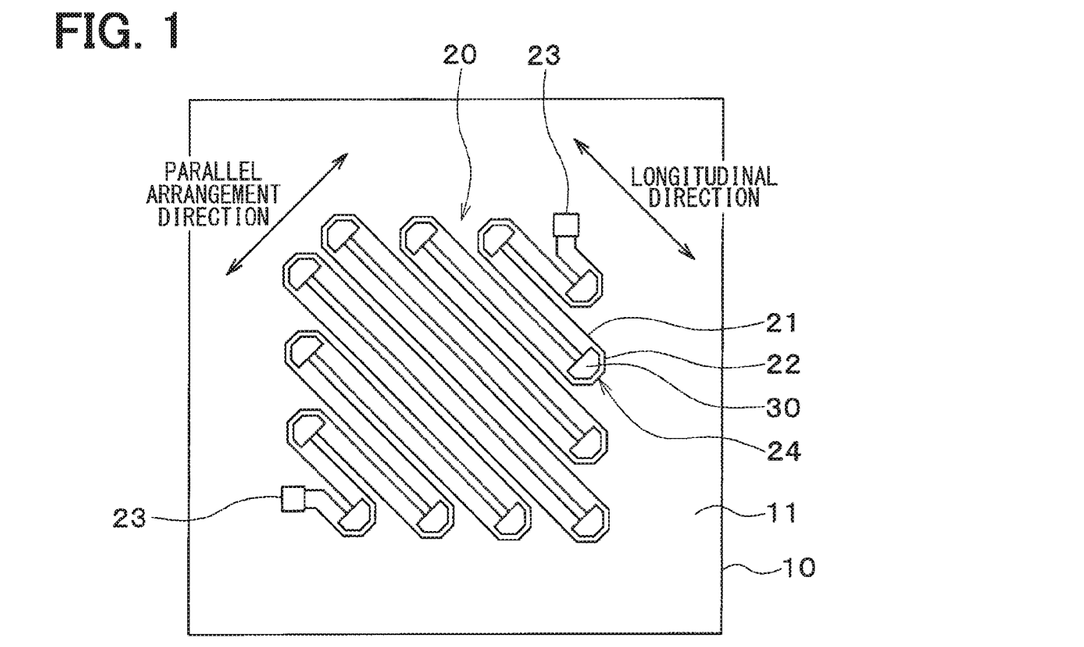
FIG. 1 is a plan view illustrating a magnetic detection element according to a first embodiment.

A first embodiment will be described with reference to the drawings. A magnetic detection element according to the present embodiment detects a change in a magnetic field, as a part of, for example, a magnetic sensor. As shown in FIG. 1, the magnetic detection element includes a substrate 10, an element part 20, and a metal film 30.

The substrate 10 is a plate-like base material having one surface 11. The substrate 10 may be a semiconductor substrate such as Si substrate on which an insulating film is formed, or an insulating substrate such as glass on which the element part 20 can be installed.

The element part 20 is formed on the surface 11 of the substrate 10. The element part 20 is formed in a thin film shape by a ferromagnetic material such as Ni—Fe or Ni—Co. The element part 20 has plural linear portions 21, plural connecting portions 22, and plural pads 23.

The linear portion 21 includes plural linear wiring arranged in parallel. The connecting portion 22 is a wiring connecting the linear portions 21 in a meandering shape. The pad 23 is a thin film portion for electrical connection with other wirings.

The element part 20 is formed on the substrate 10 by vapor deposition or the like. The linear portion 21 and the connecting portion 22 are continuously formed by a meandering-shaped mask for exclusive use. Similarly, the pad 23 is formed by a dedicated mask.

Although not shown, plural element parts 20 are formed on the substrate 10. For example, a bridge circuit is defined by the element parts 20. Further, the substrate 10 molded with a resin material is placed in the vicinity of a bias magnet (not shown).

In such a state, the resistance value of the element part 20 varies in accordance with a change in the bias magnetic field (a change in the magnetic vector). A signal is output based on a change in the resistance value of each element part 20 when being affected by an external magnetic field. The signal is processed by a signal processing circuit for performing a preset operation.

The metal film 30 is made of a metal material whose resistance value is smaller than that of the element part 20 and whose resistance value is not changed by an external magnetic field. The metal film 30 is formed on the turn portion 24 using a dedicated mask by vapor deposition or the like. The turn portion 24 is a U-shaped portion of the element part 20 defined by a connection between the connecting portion 22 and the linear portion 21 and the connecting portion 22. The metal film 30 is thicker than the element part 20.

The metal film 30 is made of Al or an alloy containing Al as a main component. By using Al, it is possible to form the metal film 30 in the semiconductor process, with high precision and at low cost. The alloy containing Al as a main component is, for example, an Al—Si alloy.

The metal film 30 may be made of Cu or an alloy containing Cu as a main component, Au or an alloy containing Au as a main component, or Ag or an alloy containing Ag as a main component, other than Al. These metals have no change in magnetoresistance with respect to the external magnetic field, and the resistivity and the contact resistance with the element part 20 are small. Therefore, the sensitivity loss of the element part 20 can be efficiently reduced.

Figure 2:
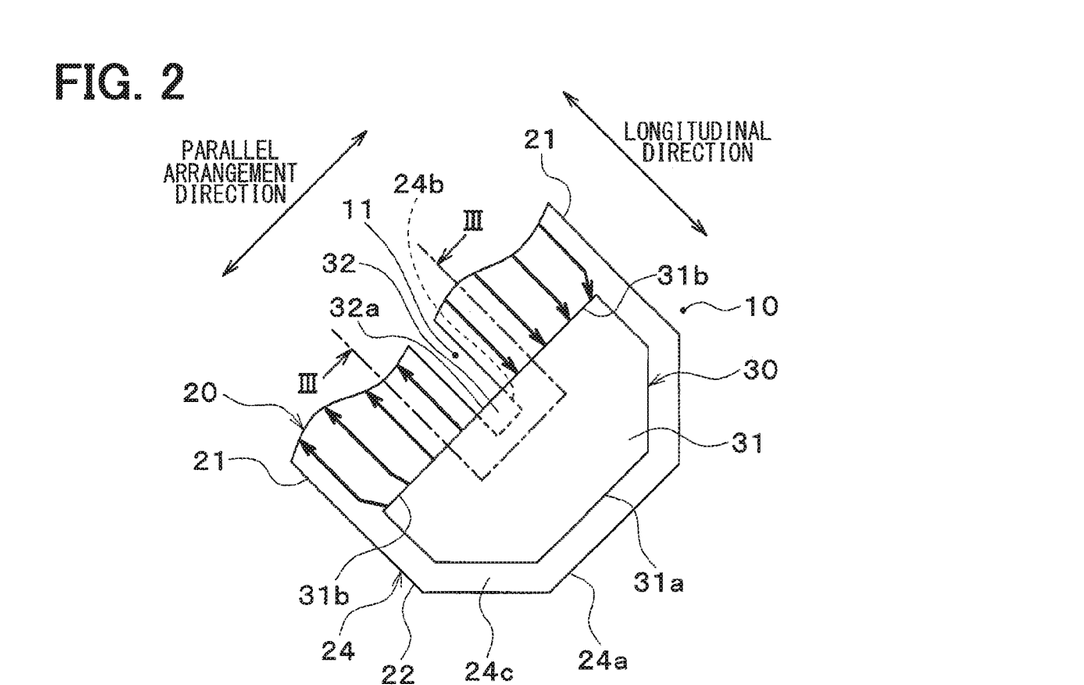
FIG. 2 is an enlarged view of a turn portion shown in FIG. 1.

As shown in FIG. 2, the metal film 30 has a first layered portion 31 and a second layered portion 32. The first layered portion 31 and the second layered portion 32 are integrally and continuously formed by above-described dedicated mask.

The first layered portion 31 is stacked on the U-shaped turn portion 24. The planar shape of the first layered portion 31 is U-shape like the turn portion 24. The first layered portion 31 has a first peripheral side 31a and a second peripheral side 31b. The first peripheral side 31a is located between the internal end 24b and the external end 24a of the turn portion 24. In the present embodiment, the first peripheral side 31a is disposed between the internal end 24b and the external end 24a of the turn portion 24 so as to expose the entirety of the outer periphery 24c of the turn portion 24. Therefore, the metal film 30 is disposed at the inner side of the turn portion 24.

The second peripheral side 31b is arranged on the linear portion 21 of the turn portion 24 to extend along the parallel arrangement direction in which the plural linear portions 21 are arranged in parallel with each other. In the present embodiment, "along the parallel arrangement direction" means "parallel to the parallel arrangement direction". The second peripheral side 31b is connected to the first peripheral side 31a. The second peripheral side 31b is disposed closer to the center part of the linear portion 21 than a part of the internal end 24b of the turn portion 24 corresponding to the connecting portion 22.

The second layered portion 32 is stacked on a part of the surface 11 of the substrate 10 so as to entirely cover an area of the surface 11 of the substrate 10 surrounded by the internal end 24b of the turn portion 24. The area surrounded by the internal end 24b is, in other words, a range surrounded by the linear portions 21 and the connecting portion 22 of the turn portion 24, not a long narrow region between the linear portions 21. The second layered portion 32 is continuously and integrally formed with the first layered portion 31 in the parallel arrangement direction and in the longitudinal direction of the linear portion 21. The parallel arrangement direction and the longitudinal direction are perpendicular to each other.

The second layered portion 32 has a third peripheral side 32a. The third peripheral side 32a is connected to the pair of second peripheral sides 31b and arranged to extend along the parallel arrangement direction. In the present embodiment, the second peripheral side 31b and the third peripheral side 32a are arranged on the same linear line along the parallel arrangement direction.

Figure 3:
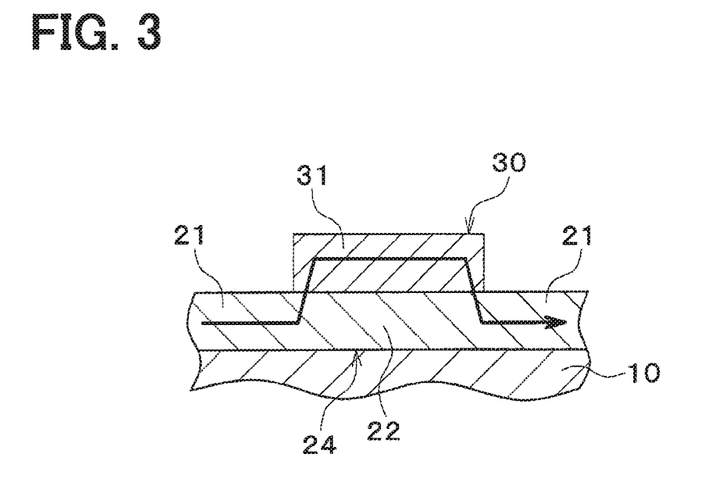
FIG. 3 is a sectional view taken along a line III-III of FIG. 2.

In the above configuration, electric current flows as indicated by arrows in FIGS. 2 and 3. That is, the electric current flows into the metal film 30 from one linear portion 21, flows inside the metal film 30, and then flows out from the metal film 30 to the other linear portion 21. As shown in FIG. 2, since the current flowing adjacency of the external end 24a of the turn portion 24 tends to flow toward the metal film 30 at the shortest distance, the current path is bent toward the internal end 24b.

Next, the action and effect will be described regarding the metal film 30 having the above-mentioned shape and stacked on the turn portion 24. First, the meandering pattern defined by the linear portions 21 and the connecting portions 22 minimizes the resistance value when the magnetic field vector of the external magnetic field and the direction of the electric current are perpendicular to each other. When the magnetic field vector of the external magnetic field and the current direction become parallel to each other, the resistance value becomes the maximum.

Figure 4:
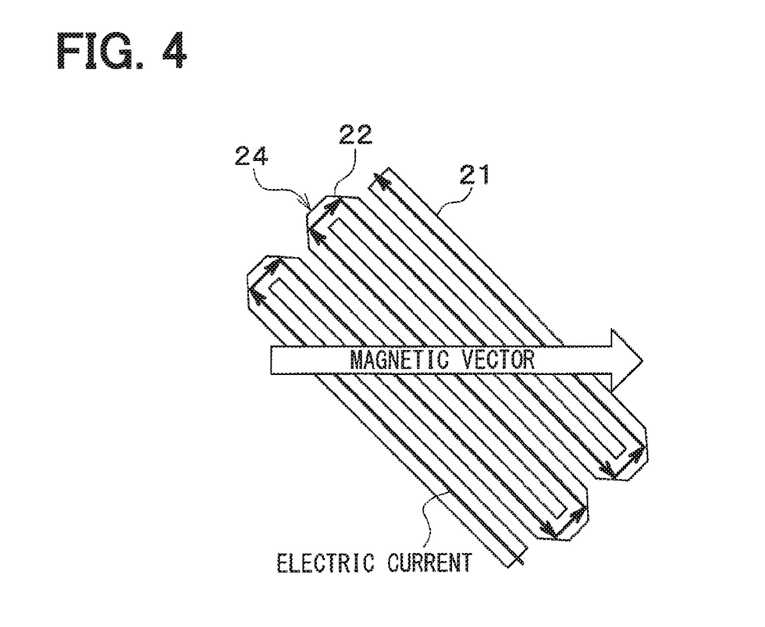
FIG. 4 is a plan view in which an external magnetic field is applied to an element part having no metal film.
Figure 5:
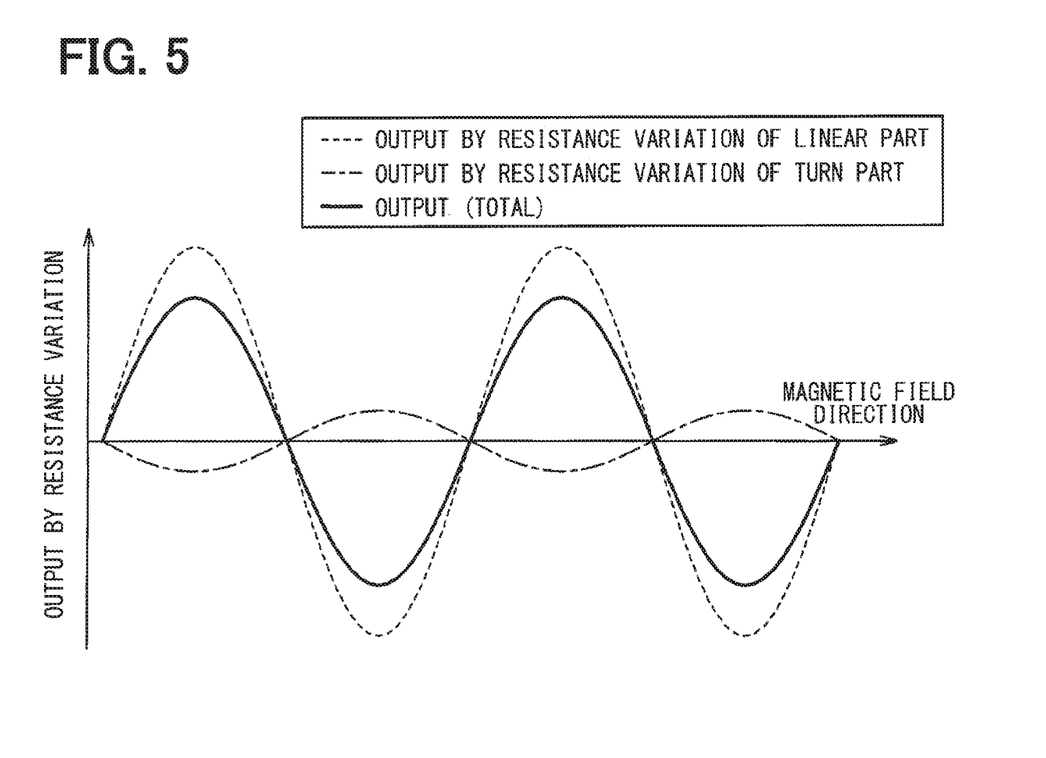
FIG. 5 is a diagram for explaining the output of the element part shown in FIG. 4.

FIG. 4 illustrates a comparative example in which the metal film 30 is not stacked, and a current flows through the connecting portion 22 of the turn portion 24. Further, the resistance of the connecting portion 22 is changed by an external magnetic field. Since the direction of the current flowing through the linear portion 21 is different from the direction of the current flowing through the connecting portion 22, as shown in FIG. 5, the output due to the resistance variation of the turn portion 24 is generated to cancel the output due to the resistance variation of the linear portion 21. Therefore, the total output from the entire pattern is smaller than the output due to the resistance variation of the linear portion 21.

Figure 6:
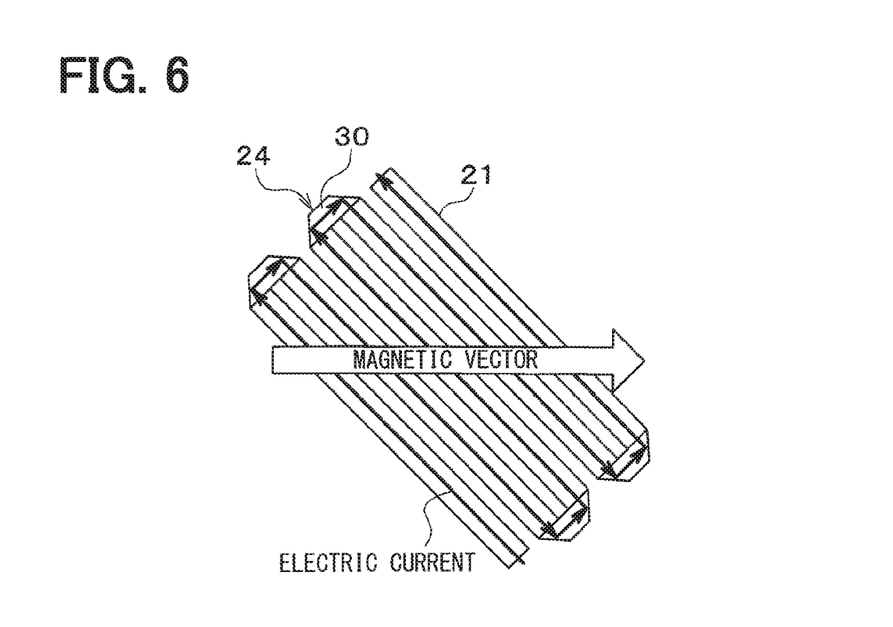
FIG. 6 is a plan view in which an external magnetic field is applied to an element part having a metal film.
Figure 7:
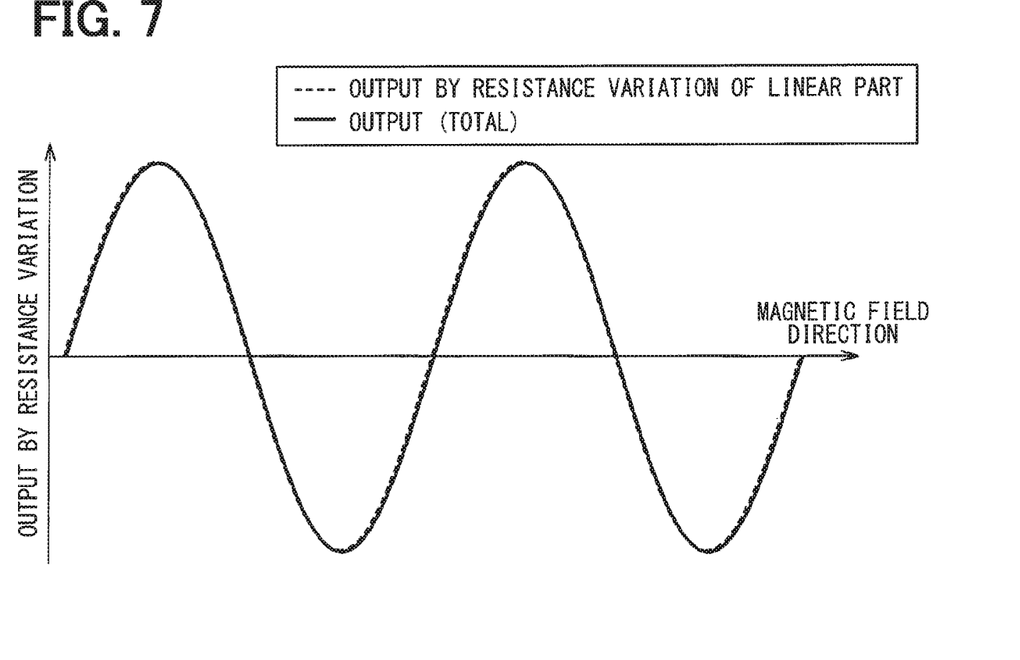
FIG. 7 is a diagram for explaining the output of the element part shown in FIG. 6.

In contrast, according to the present embodiment, as shown in FIG. 6, since the low-resistance metal film 30 is stacked on the turn portion 24, the electric current flows through the metal film 30 having the small resistance value, and the electric current does not flow into the connecting portion 22 of the turn portion 24. In other words, the current is not affected by change in resistance of the connecting portion 22 of the turn portion 24 caused by the external magnetic field. Therefore, as shown in FIG. 7, the output due to the resistance change of the linear portion 21 is equal to the total output from the element part 20. In this manner, the sensitivity loss at the turn portion 24 can be reduced because the output from the entire pattern of the element part 20 is substantially the same as the output due to the resistance change of the linear portion 21.

In addition, the element part 20 may not have the connecting portion 22, and the linear portion 21 may be directly connected to the metal film 30. Compared with such a configuration, the present embodiment can avoid a risk of peeling of the metal film 30 from the linear portion 21 and a risk of disconnection/malfunction due to an increase in the interface resistance between the linear portion 21 and the metal film 30.

When forming plural metal films 30 on the pattern of the element part 20 at the same time, one dedicated mask is used. In this case, the dedicated mask of the metal film 30 may be misaligned with respect to the pattern of the element part 20 in some cases. However, the metal film 30 positioned at one side in the longitudinal direction of the linear portion 21 and the metal film 30 positioned at the other side in the longitudinal direction are simultaneously misaligned in the same direction. Therefore, even if the positional displacement of the metal film 30 with respect to the element part 20 occurs, the distance of the linear portion 21 in the longitudinal direction from the metal film 30 at the one side to the metal film 30 on the other side does not change and is always constant. Therefore, the sensitivity of the element part 20 and the current consumption are made stable.

Even if the positional displacement of the metal film 30 occurs as described above, the second layered portion 32 of the metal film 30 is necessarily disposed in the region surrounded by the internal end 24b of the turn portion 24. That is, the metal film 30 is necessarily disposed at the inner side of the turn portion 24. For this reason, since the current always flows through the metal film 30 instead of the turn portion 24, the current is not affected by the resistance change of the turn portion 24 caused by the external magnetic field. Therefore, it is possible to suppress a decrease in the sensitivity of the element part 20. Further, since the metal film 30 has the second layered portion 32, it is also possible to increase the tolerance of the displacement of the metal film 30 toward the center of the linear portion 21 in the longitudinal direction of the linear portion 21.

Furthermore, since the metal film 30 is disposed at the inner side of the turn portion 24 so that the outer periphery 24c of the turn portion 24 is exposed to outside, the first layered portion 31 of the metal film 30 does not interfere with the adjacent turn portion 24. Therefore, it is not necessary to previously secure the interval between the linear portions 21 and the interval between the turn portions 24 adjacent to each other. In other words, these intervals can be narrowed within the manufacturable range. Therefore, the area of the element part 20 can be reduced. In addition, it is possible to maintain the degree of integration of the pattern of the element part 20 while the metal film 30 is stacked on the turn portion 24.

As described above, the element part 20 can be formed in a small area. Therefore, when the magnetic detection element is configured as a part of a magnetic sensor, the size of the bias magnet can be reduced and the flexibility can be increased for selection of materials, to reduce the cost.

Second Embodiment

Figure 8:
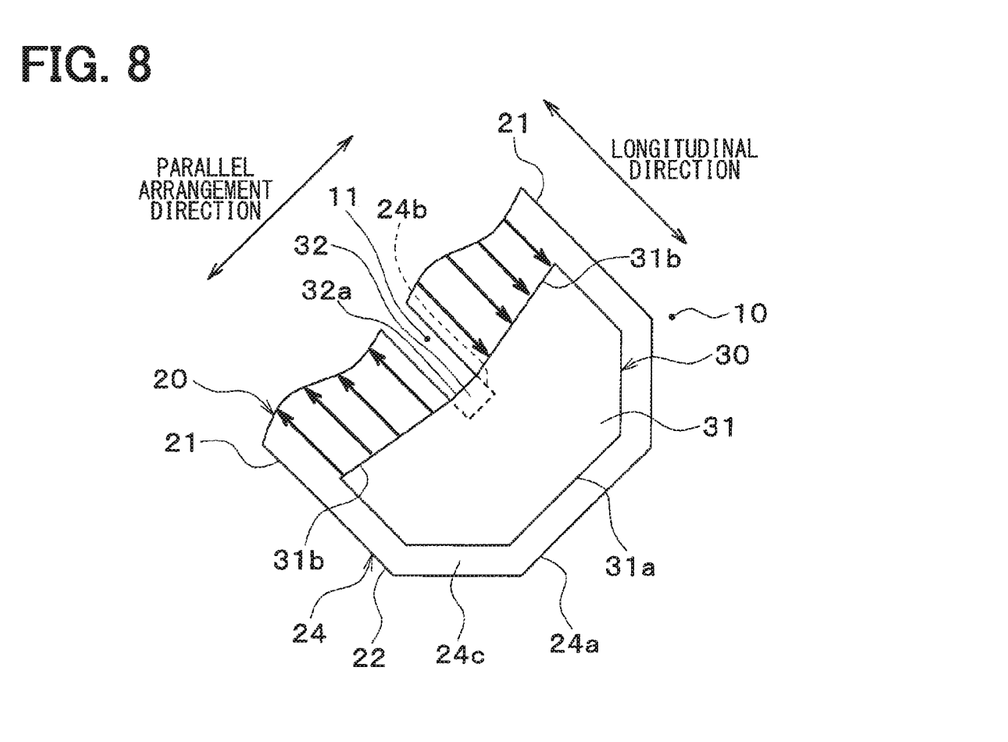
FIG. 8 is a plan view illustrating a turn portion according to a second embodiment.

In the present embodiment, configurations different from those of the first embodiment will be described. As shown in FIG. 8, the second peripheral side 31b of the first layered portion 31 is extended to separate away from the connecting portion 22 toward the linear portion 21, in other words, as extending from the third peripheral side 32a of the second layered portion 32 toward the first peripheral side 31a. In other words, the second peripheral side 31b is inclined with respect to the third peripheral side 32a parallel to the parallel arrangement direction.

Accordingly, when the current flowing in adjacency of the external end 24a of the turn portion 24 flows into the metal film 30, the current path is not bent. That is, it is possible to ensure the linearness of current flowing in adjacency of the external end 24a of the turn portion 24. In other words, rectification of the current is improved. As a result, it is possible to suppress concentration of current to the inner side of the turn portion 24, inside the metal film 30.

Figure 9:
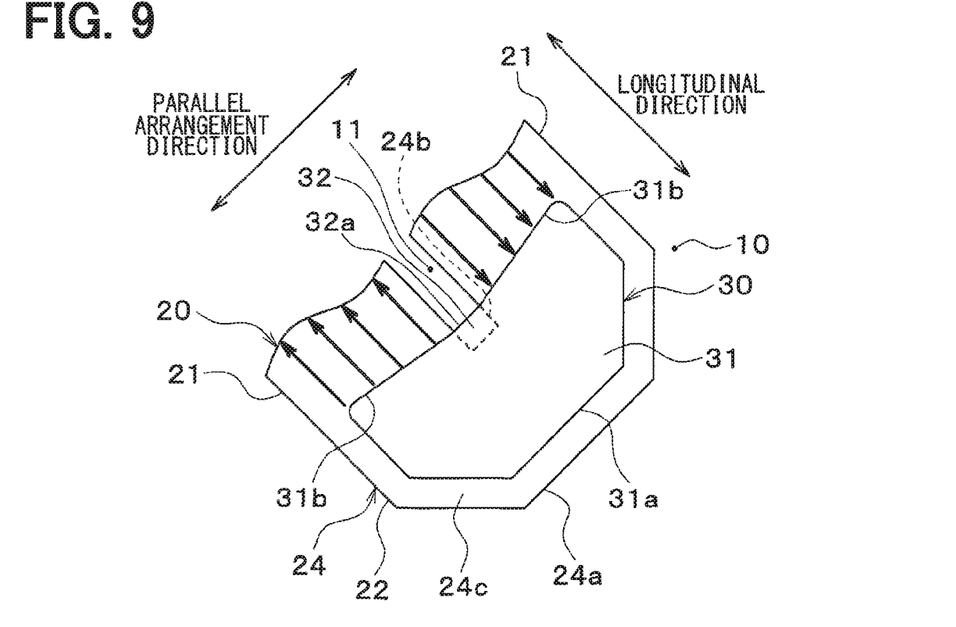
FIG. 9 is a plan view illustrating a modification of the turn portion of the second embodiment.

As a modification illustrated in FIG. 9, the connection between the first peripheral side 31a and the second peripheral side 31b of the first layered portion 31 may be in the curved shape. Accordingly, since the current concentration at the connection between the first peripheral side 31a and the second peripheral side 31b is relieved, the withstand voltage of the metal film 30 can be increased.

Third Embodiment

Figure 10:
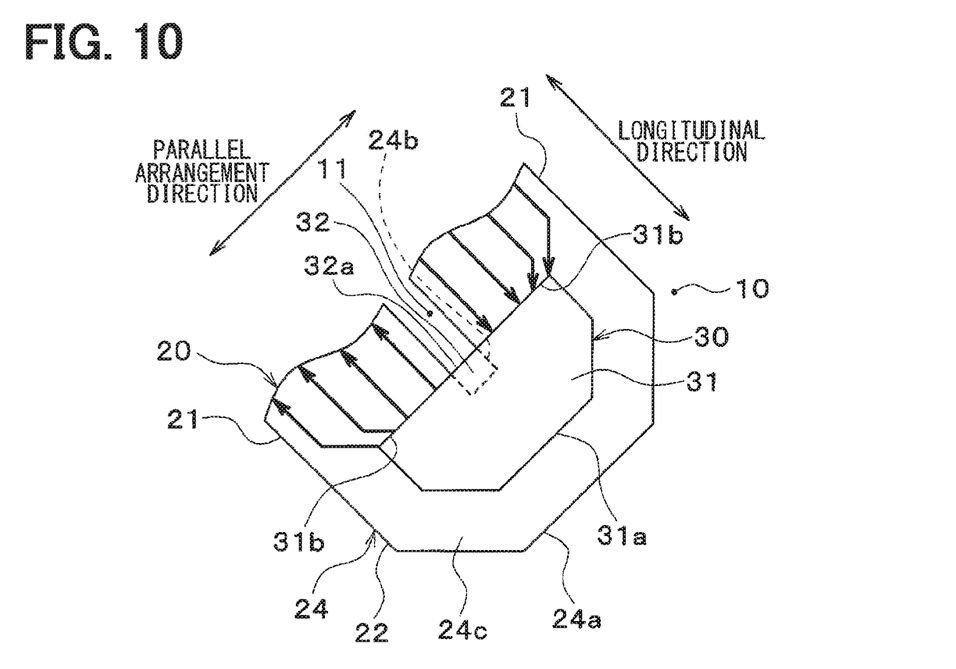
FIG. 10 is a plan view illustrating a turn portion according to a third embodiment.

In the present embodiment, configurations different from those of the first and second embodiments will be described. As shown in FIG. 10, the line width of the first layered portion 31 is 50% or more of the line width of the turn portion 24. The line width of the turn portion 24 is a width of the turn portion 24 in the parallel arrangement direction of the linear portions 21.

Figure 11:
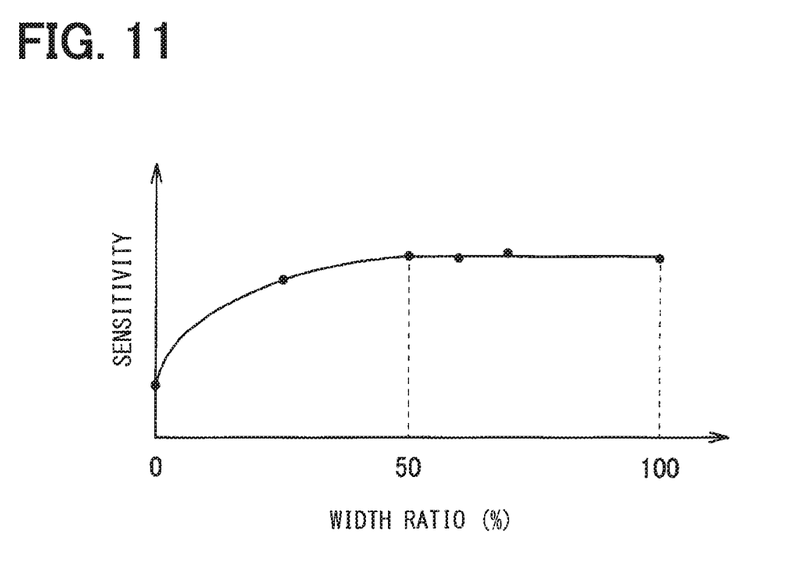
FIG. 11 is a graph illustrating a relationship between a ratio of a line width of a first layered portion to a line width of a turn portion and a sensitivity of the element part.

The inventors investigated a change in the sensitivity of the element part 20 when the line width of the first layered portion 31 is changed. The results are shown in FIG. 11, in which the change in resistivity of the element part 20 is measured as sensitivity. The horizontal axis of the graph of FIG. 11 represents a ratio of the line width of the metal film 30 to the line width of the turn portion 24, and the vertical axis represents the sensitivity.

As shown in FIG. 11, when the line width of the first layered portion 31 is 50% or more of the line width of the turn portion 24, the sensitivity is substantially constant and sufficient sensitivity can be obtained. When the line width of the first layered portion 31 is less than 50% of the line width of the turn portion 24, the sensitivity also decreases as the ratio of the line width decreases. When the line width is 0%, this is the case where the metal film 30 does not exist. From such a result, it is preferable that the line width of the first layered portion 31 is 50% or more of the line width of the turn portion 24. Since the current flowing through the metal film 30 concentrates toward the internal end 24b of the turn portion 24, the effect of reducing sensitivity loss can be effectively utilized.

Fourth Embodiment

Figure 12:
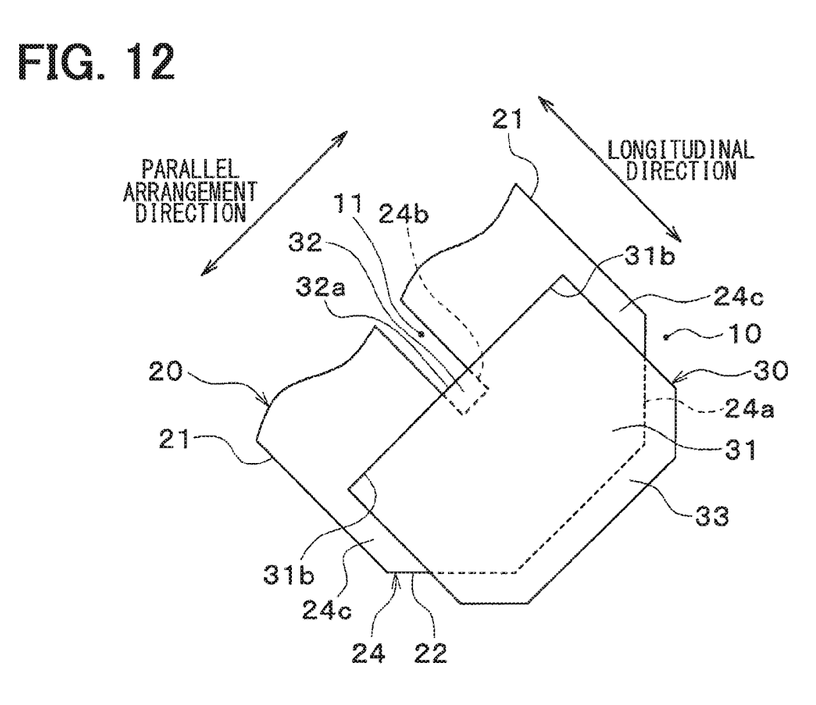
FIG. 12 is a plan view illustrating a turn portion according to a fourth embodiment.

In this embodiment, configurations different from the first to third embodiments will be described. As shown in FIG. 12, the metal film 30 has a third layered portion 33 that covers a part of the outer periphery 24c of the turn portion 24.

Specifically, the third layered portion 33 is integrally formed with the first layered portion 31 in the longitudinal direction of the linear portion 21 from the linear portion 21 toward the connecting portion 22. The third layered portion 33 is formed narrower than the maximum width of the turn portion 24 in the parallel arrangement direction of the linear portions 21. In the present embodiment, the width of the third layered portion 33 in the parallel arrangement direction is the same as that of the first layered portion 31. The width of the third layered portion 33 in the parallel arranging direction may be different from that of the first layered portion 31.

Furthermore, the third layered portion 33 is arranged to cover an area from the first layered portion 31 to the surface 11 of the substrate 10. Thereby, the third layered portion 33 covers a part of the outer periphery 24c and a part of the external end 24a, which are located opposite from the second layered portion 32 through the first layered portion 31. As a result, a part of the outer periphery 24c of the turn portion 24 adjacent to the external end 24a in the parallel arrangement direction is exposed.

As described above, the third layered portion 33 can be provided on the metal film 30 so as not to interfere with the adjacent turn portion 24 or the adjacent linear portion 21.

Fifth Embodiment

Figure 13:
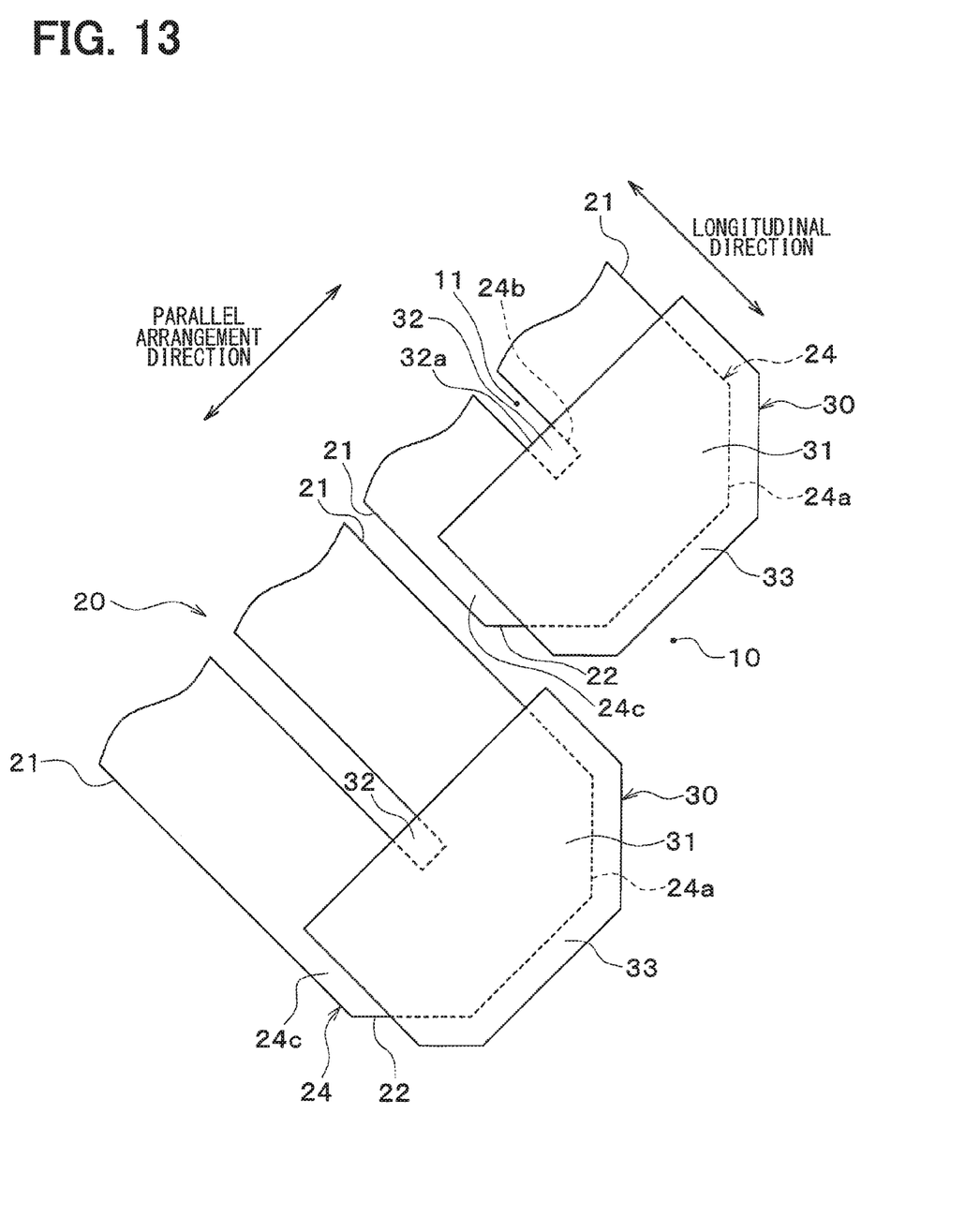
FIG. 13 is a plan view illustrating a turn portion according to a fifth embodiment.

In the present embodiment, portions different from those in the fourth embodiment will be described. As shown in FIG. 13, in the present embodiment, the turn portions 24 are placed offset from each other in the longitudinal direction of the linear portion 21. The turn portions 24 are arranged in a stepwise manner in the parallel arrangement direction or the longitudinal direction of the linear portion 21 with respect to the adjacent turn portion 24.

The third layered portion 33 is formed integrally with the first layered portion 31 not only in the longitudinal direction from the linear portion 21 toward the connecting portion 22 but also in the parallel arranging direction in which the adjacent turn portion 24 is not located. In other words, the third layered portion 33 has L-shape. Furthermore, the third layered portion 33 is arranged in an area from the first layered portion 31 to the surface 11 of the substrate 10. As a result, the third layered portion 33 covers a part of the outer periphery 24c and a part of the external end 24a where the linear portion 21 is not next-to positioned.

As described above, the same effects as those of the fourth embodiment can be obtained also in the pattern where the turn portions 24 are arranged in the repeatedly stepwise manner.

Other Embodiments

The magnetic detection element in each of the embodiments is merely an example, and the present disclosure can be implemented without limited to the configuration described above, by adopting the other configurations. For example, the connecting portion 22 of the turn portion 24 has a trapezoidal shape in the above description, as an example of a planar shape. In addition, the metal film 30 in the second embodiment can be applied to the third to fifth embodiments.

In each of the embodiments, the turn portion 24 is formed in a U-shape, as an example. The turn portion 24 may have other shape, for example, V-shape or the like, other than the U-shape.

In the above embodiments, the planar shape of the first layered portion 31 is the same as that of the turn portion 24, but this is an example. The planar shape of the first layered portion 31 may be semicircular or sector, other than the U-shape.

What is claimed is:

1. A magnetic detection element comprising:
   an element part arranged on a surface of a substrate as a ferromagnetic thin film, the element part having a plurality of linear portions arranged in parallel with each other and a plurality of connecting portions connecting the plurality of linear portions in a meandering shape;
   the linear portions are arranged adjacent to each other in a parallel arrangement direction, each of the linear portions having ends in a longitudinal direction, each of the connecting portions having side walls that are parallel to an extending direction of the linear portions and turning to form an oblique angle with respect to the extending direction of the linear portions and having two ends connecting each respectively to one end each of two adjacent linear portions, and a metal film having a resistance value smaller than that of the element part, the resistance value of the metal film being not changed by an external magnetic field, wherein the metal film has a first layered portion stacked on a turn portion of the element part, the turn portion being one of the connecting portions and the respective end of each one of the two adjacent linear portions which connects to the one of the connecting portions, and a second layered portion formed integrally with the first layered portion to entirely cover a region of the surface surrounded by an internal end of the turn portion, the first layered portion has a peripheral side disposed between the internal end and an external end of the turn portion so as to expose an outer periphery of the turn portion, the second layered portion covers an entirety of an area of the surface defined by the connecting portion and the ends of each linear portion adjacent to the connecting portion, wherein an electric current flows through the adjacent linear portions and the metal film stacked on the turn portion without flowing into the connecting portion, and the metal film stacked on the connecting portion has ends in a parallel arrangement direction in which the plurality of linear portions are arranged in parallel with each other, and an outer periphery of the connecting portion in the parallel arrangement direction is exposed from the ends of the metal film in the parallel arrangement direction.

2. The magnetic detection element according to claim 1, wherein the peripheral side is defined as a first peripheral side, the first layered portion has a second peripheral side connected to the first peripheral side, the second peripheral side being arranged on a part of the two linear portions that connect to the connecting portion of the turn portion, the second peripheral side extending along a parallel arrangement direction in which the plurality of linear portions are arranged in parallel with each other, the second layered portion has a third peripheral side connected to the second peripheral side, the third peripheral side extending along the parallel arrangement direction, and the second peripheral side is inclined with respect to the third peripheral side to separate away from the connecting portion toward the two linear portions as extending from the third peripheral side.

3. The magnetic detection element according to claim 2, wherein a connection between the first peripheral side and the second peripheral side has a curved shape.

4. The magnetic detection element according to claim 1, wherein a line width of the first layered portion is more than or equal to 50% of a line width of the turn portion.

5. The magnetic detection element according to claim 1, wherein the peripheral side of the first layered portion is located between the internal end and the external end so as to expose an entirety of the outer periphery of the turn portion.

6. The magnetic detection element according to claim 1, wherein the turn portion is formed in a shape which is a U-shape, a trapezoidal shape, or a V-shape, and the outer periphery which is exposed is an outer periphery of the turn portion.

7. The magnetic detection element according to claim 1, wherein the metal film is formed in a shape which is a U-shape, a trapezoidal shape, or a V-shape, and the outer periphery which is exposed is an outer periphery of the turn portion.

* * * * *